(12) United States Patent
Evans

(10) Patent No.: US 6,521,962 B2
(45) Date of Patent: Feb. 18, 2003

(54) HIGH VOLTAGE MOS DEVICES

(75) Inventor: Ivor Robert Evans, Gwent (GB)

(73) Assignee: International Rectifier Corporation, El Segundo, CA (US)

( * ) Notice: Subject to any disclaimer, the term of this patent is extended or adjusted under 35 U.S.C. 154(b) by 145 days.

(21) Appl. No.: 09/775,943

(22) Filed: Feb. 5, 2001

(65) Prior Publication Data

US 2002/0072186 A1 Jun. 13, 2002

(51) Int. Cl.[7] .................. H01L 31/119; H01L 23/58
(52) U.S. Cl. .................. 257/409; 257/410; 257/408; 257/491; 257/492; 257/493
(58) Field of Search ................. 257/341, 361, 257/213, 409, 410, 408, 491, 492, 493; 438/306, 286

(56) References Cited

U.S. PATENT DOCUMENTS

| | | | |
|---|---|---|---|
| 4,232,327 A | 11/1980 | Hsu | 357/23 |
| 5,512,495 A | * 4/1996 | Mei et al. | 438/286 |
| 5,591,657 A | 1/1997 | Fujishima et al. | 437/41 |
| 6,133,107 A | 10/2000 | Menegoli | 438/306 |

FOREIGN PATENT DOCUMENTS

JP  62222676  * 9/1987

* cited by examiner

*Primary Examiner*—Minh Loan Tran
*Assistant Examiner*—Tan Tran
(74) *Attorney, Agent, or Firm*—Ostrolenk, Faber, Gerb & Soffen, LLP

(57) ABSTRACT

A P channel high voltage metal oxide semiconductor device is described which is integrated in the same chip or wafer as standard P channel and N channel metal oxide semiconductor devices. The high voltage device has a lightly doped $p^-$ drift region adjacent to the heavily doped $p^+$ drain region. A high voltage support region is formed directly below the drift region using high energy ion implantation with an implantation energy of between about 2 and 3 Mev. This high energy ion implantation is used to precisely locate the high voltage support region directly below the drift region. This high voltage support region avoids punch-through from the P channel drain through the drift region into the substrate while using a standard depth for the n type well. This allows the high voltage device to be integrated into the same chip or wafer as standard P channel and N channel metal oxide semiconductor devices.

8 Claims, 5 Drawing Sheets

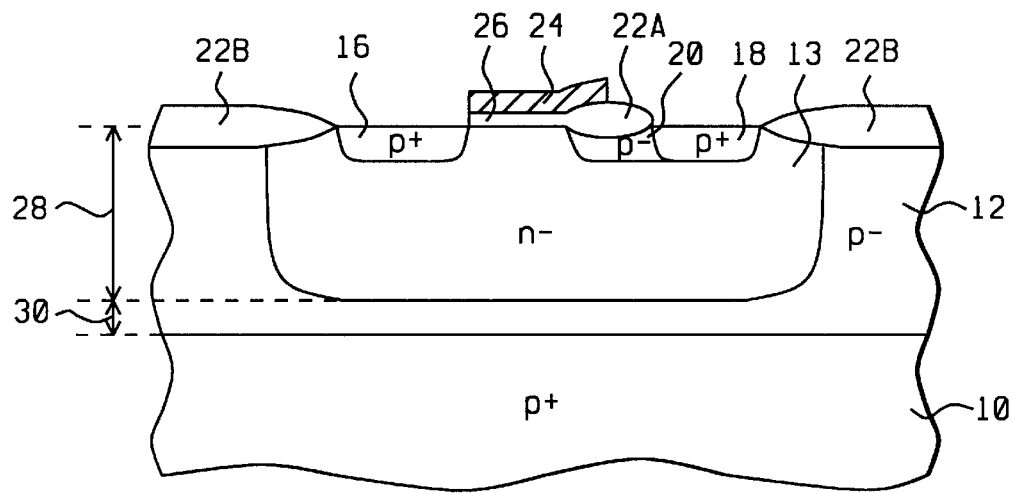
FIG. 1 – Prior Art
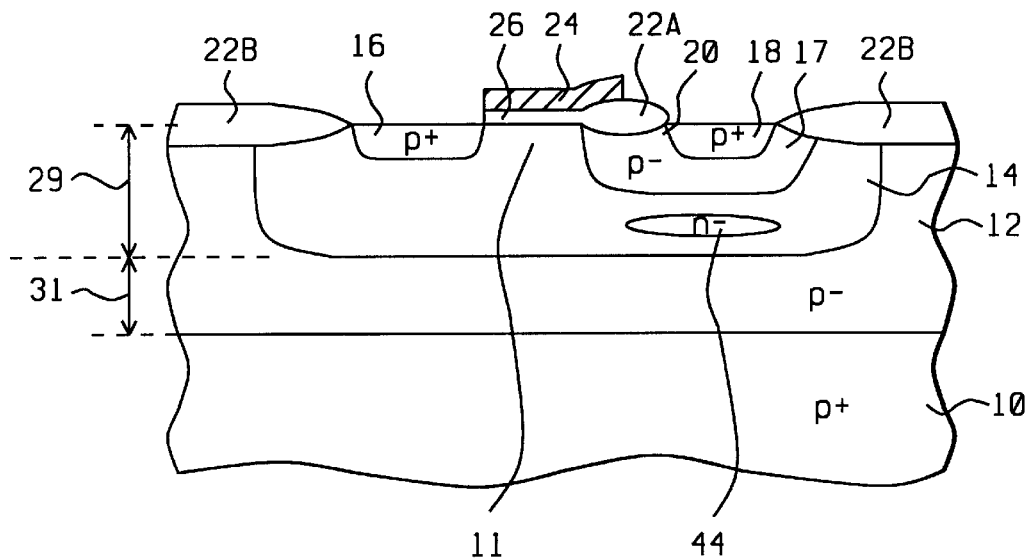
FIG. 2

HIGH VOLTAGE MOS DEVICES

BACKGROUND OF THE INVENTION (1) Field of the Invention

This invention relates to high voltage MOS, metal oxide semiconductor, devices and methods of forming MOS devices, and more particularly to high voltage MOS devices which do not require a deep n type silicon well or p type silicon well.

(2) Field of the Invention

It is frequently desirable to fabricate high voltage metal oxide semiconductor, MOS, devices. These devices typically use lightly doped drift regions adjacent to more heavily doped drain regions to suppress the onset of avalanche multiplication. These devices also typically use an n well or p well having increased depth.

U.S. Pat. No. 4,232,327 to Hsu and U.S. Pat. No. 5,512,495 to Mei et al. describes high voltage MOSFETs, metal oxide semiconductor field effect transistors, using a lightly doped drift region adjacent to a more heavily doped drain.

U.S. Pat. No. 6,133,107 to Menegoli and U.S. Pat. No. 5,591,675 to Fujishima et al. describe high voltage MOSFETs using deep well regions.

SUMMARY OF THE INVENTION

It is frequently desirable to form standard voltage N channel or P channel metal oxide semiconductor and high voltage N channel metal oxide semiconductor devices on the same chip or wafer. This is not possible if the high voltage P channel device requires a deep n well. FIG. 1 shows a cross section view of a high voltage P channel device. A lightly doped epitaxial layer 12 of p⁻ type silicon is formed over a substrate 10 of heavily doped p⁺ type silicon. The lightly doped well 13 of n⁻ type silicon, in which the high voltage device is formed, has a depth 28 larger than that for a typical device. This results in a smaller gap 30 between the bottom of the well 13 and the substrate 10. The typical high voltage device shown in FIG. 1 has a p⁺ type source 16 on one side of the channel, a p⁻ type drift region 20 on the other side of the channel, and a p⁺ type drain adjacent to the drift region 20. The device shown in FIG. 1 also has a thick oxide 22A overlaying the drift region 20, thick oxide isolation regions 22B, a gate oxide layer 26, and a gate electrode 24.

The depth 28 of the well is a critical factor in determining the operating voltage of the high voltage P channel device. If the well 13 is too deep the well to substrate gap 30 will be too small which will reduce the maximum operating voltage available. If the well 13 is too shallow punch-through from the P channel drain 18 through the drift region 20 into the substrate 10 will occur. The formation of a deep well of n type silicon is typically formed using a Phosphorous implant followed by a long thermal drive in. This thermal drive in has the undesirable effect of enhancing diffusion of impurities from the p⁺ substrate 10 into the p⁻ epitaxial layer. This requires a thicker p⁻ epitaxial layer which will degrade the latch-up immunity of standard CMOS devices, causing problems for integrating high voltage devices and standard devices in the same chip or wafer.

It is a principle objective of this invention to provide a method of forming high voltage metal oxide semiconductor P channel devices without increasing the depth of the well of n type silicon in which the high voltage devices are located and which can be integrated on the same chip or wafer with standard metal oxide semiconductor devices.

It is another principle objective of this invention to provide high voltage metal oxide semiconductor P channel devices having a standard depth of the well of n type silicon in which the high voltage devices are located and which can be integrated on the same chip or wafer with standard metal oxide semiconductor devices.

These objectives are achieved by implanting a high voltage support region 44, see FIG. 2, directly below the drift region 20. The high voltage support region is doped to be heavily doped n type silicon, n+ type silicon. A higher energy implanter than that used in forming other doped regions is used to locate the high voltage support region directly below the drift region 20. This high voltage support region avoids punch-through from the P channel drain 18 through the drift region 20 into the substrate 10 while using a standard depth for the n type well 14, see FIG. 2.

BRIEF DESCRIPTION OF THE DRAWINGS

FIG. 1 shows a cross section view of a standard P channel high voltage metal oxide semiconductor device having a deep n well.

FIG. 2 shows a cross section view of a P channel high voltage metal oxide semiconductor device of this invention having an ion implanted high voltage support region and an n well of standard depth.

DESCRIPTION OF THE PREFERRED EMBODIMENTS

Figure 3:
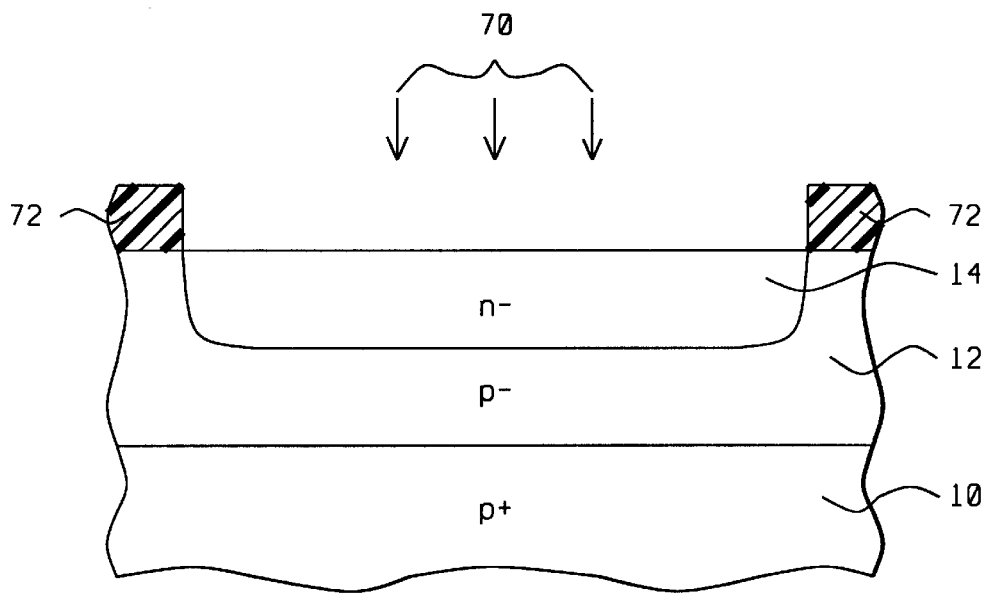
FIG. 3 shows a cross section view of the formation of an n type well of standard depth, in a p⁻ epitaxial region formed on a p⁺ type substrate, using ion implantation.

Refer to FIG. 2 for a detailed description of the high voltage metal oxide semiconductor device of this invention. FIG. 2 shows a cross section view of the high voltage, P channel, metal oxide semiconductor device of this invention. The device is formed on a heavily doped p⁺ type substrate 10 having an impurity density of between about $5 \times 10^{19}$ and $1.3 \times 10^{20}$ atoms/cm³. A lightly doped p⁻ type epitaxial layer 12, having an impurity density of between about $1 \times 10^{15}$ and $3 \times 10^{15}$ atoms/cm³, is formed on the substrate 10. A lightly doped n⁻ type well 14, having an impurity density of between about $1 \times 10^{16}$ and $4 \times 10^{16}$ atoms/cm³ and a standard well depth 29 of between about 4 and 6 microns, is formed in the epitaxial layer 12. There is a standard gap 31 between the bottom of the n⁻ type well 14 and the substrate 10.

Heavily doped p+ type source 16 and drain 18 regions, having an impurity density of between about $5 \times 10^{19}$ and $2 \times 10^{20}$ atoms/cm$^3$ are formed in the n− type well 14. A lightly doped p− type drift region 17, having an impurity density of between about $3 \times 10^{16}$ and $7 \times 10^{16}$ atoms/cm$^3$, is formed in the n− type well 14 adjacent to the drain 18. A thick oxide layer 22, thermally grown field silicon oxide, is formed over the drift region 20. A gate electrode 24 and gate oxide 26, silicon oxide, are formed over the channel region 11. The key part of the device of this invention is a n− doped high voltage support region 44 formed directly under the drift region 17. The high voltage support region 44 has an impurity density of between about $5 \times 10^{15}$ and $2 \times 10^{16}$ atoms/cm$^3$. The channel region 11 is between the source 16 and the drift region 17. The device shown in FIG. 2 and described herein can operate at voltages up to about 35 volts between the source 16 and drain 18.

Refer now to FIGS. 2–9 for a detailed description of the preferred method of forming the P channel high voltage metal oxide semiconductor device of this invention. FIG. 3 shows a lightly doped p− type epitaxial layer 12, having an impurity density of between about $1 \times 10^{15}$ and $3 \times 10^{15}$ atoms/cm$^3$, formed on a heavily doped p+ type substrate 10 having an impurity density of between about $5 \times 10^{19}$ and $1.3 \times 10^{20}$ atoms/cm$^3$. A first resist mask 31 is formed over the epitaxial layer and an ion beam 29 implants a beam of phosphorous ions into the epitaxial layer 12, using an implantation energy of between about 120 and 180 kev, to form a lightly doped n− type well 14 with an impurity concentration of between about $1 \times 10^{16}$ and $4 \times 10^{16}$ atoms/cm$^3$. The first resist mask 72 is formed using photoresist and standard photolithographic techniques. The first resist mask is then removed and the well 14 is driven in such that the final well depth 29 is between about 4 and 6 microns.

Figure 4:
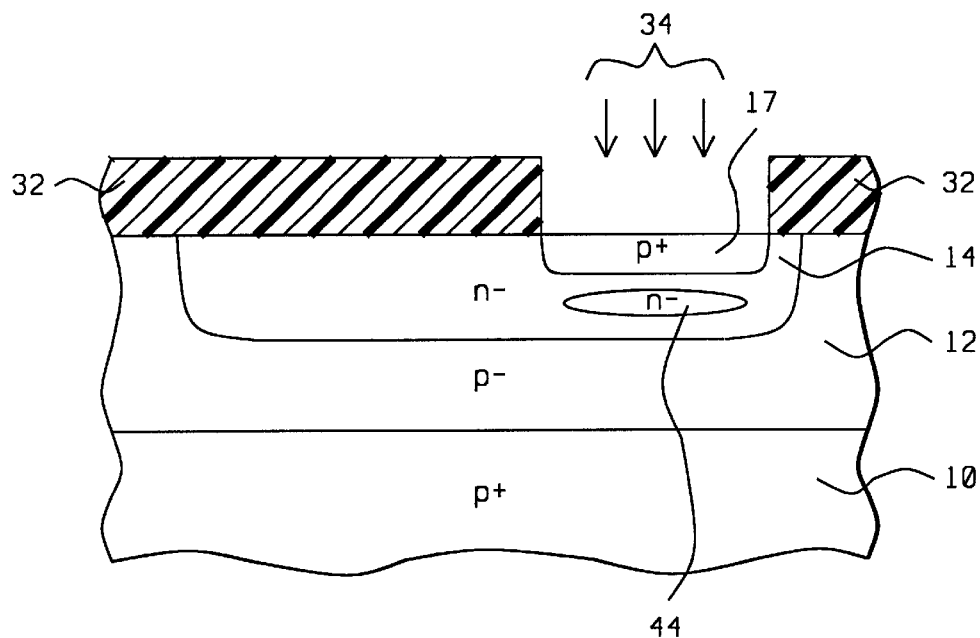
FIG. 4. shows a cross section view of the formation of a p⁻ type region which will form the drain drift region, along with the formation of the underlying high voltage support region.

As shown in FIG. 4, a second resist mask 32 is then formed having an opening at the location of the drain and drift regions. A lightly doped p− region 17 is then formed using ion implantation wherein the ion implantation beam 34 is a beam of boron ions, thereby forming a lightly doped p− region 17 having an impurity concentration of between about $3 \times 10^{16}$ and $7 \times 10^{16}$ atoms/cm$^3$. The ion implantation energy of the boron ions can be, for example, between about 270 and 330 kev. This lightly doped p− region 17 will become the drift region. The second resist mask 32 is formed using photoresist and standard photolithographic techniques.

Referring again to FIG. 4, the next step is the key step of the invention wherein a high voltage support region 44 is formed. This step uses ion implantation wherein the ion implantation beam 34 is a beam of phosphorous. This ion implantation step uses an implantation energy of between about 2 and 3 Mev. This implantation energy allows the high voltage support region 44 to be precisely located directly under the drift region 17. The high voltage support region 44 has an impurity concentration of between about $5 \times 10^{15}$ and $2 \times 10^{16}$ atoms/cm$^3$.

Figure 5A:
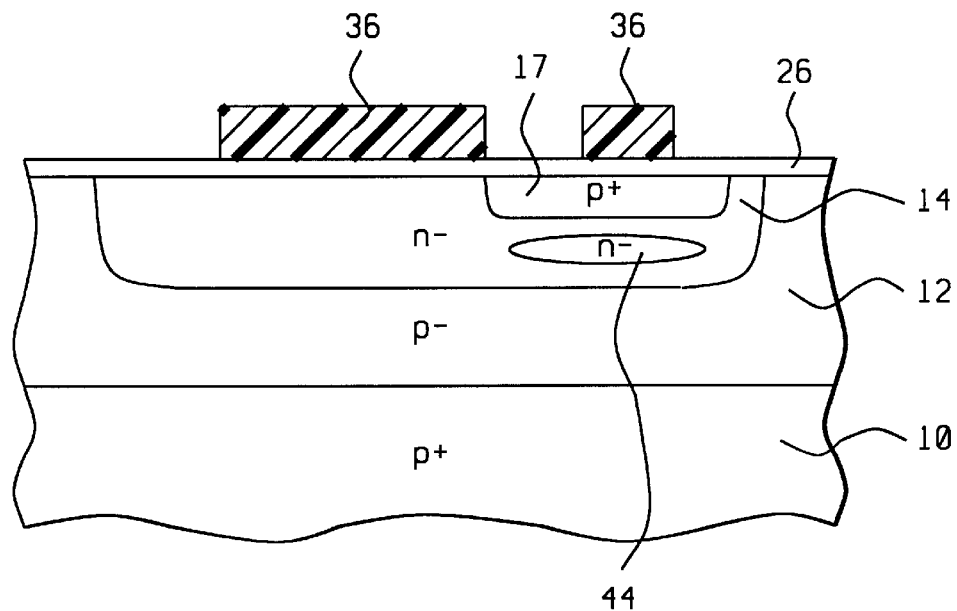
FIG. 5A shows a cross section view of the mask used to grow the thick oxide regions.
Figure 5B:
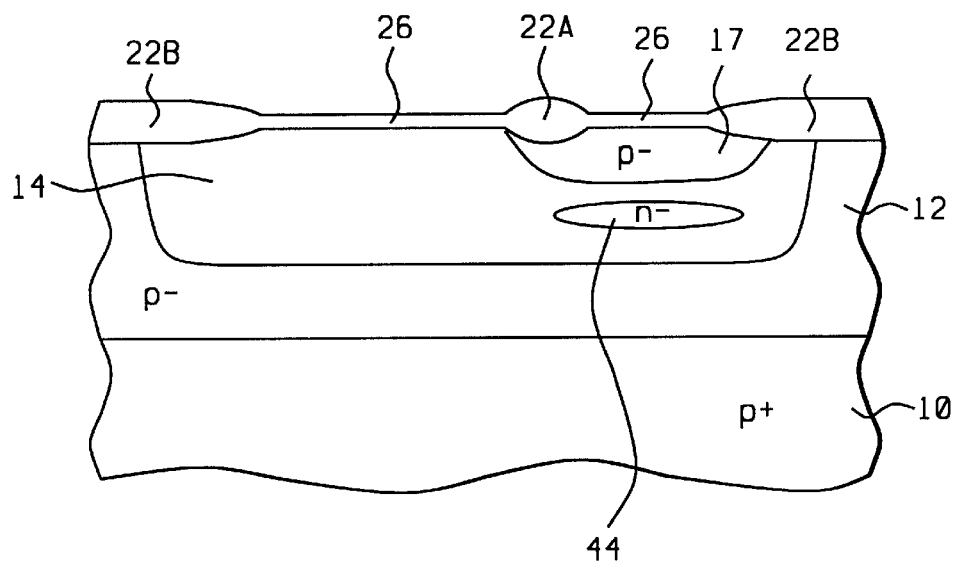
FIG. 5B shows a cross section view of the thin and thick oxide regions after removal of the mask.

As shown in FIG. 5A the second resist mask is removed and a third resist mask 36 is then formed having openings for thick oxide regions. The third resist mask 36 is formed using photoresist and standard photolithographic techniques. As shown in FIG. 5B, thick oxide regions 22A and 22B are then formed using conventional LOCOS techniques. The third resist mask is thin removed. The thick oxide regions identified by reference number 22B are used to isolate the adjacent transistors. The thick oxide region identified by reference number 22A is used to reduce the electric field in this region.

Figure 6:
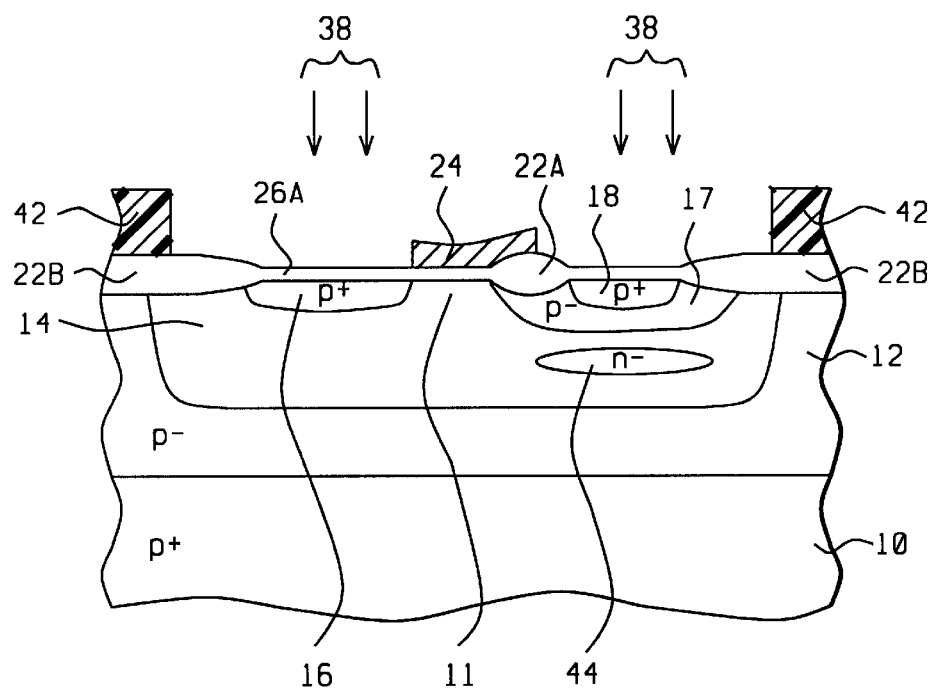
FIG. 6 shows a cross section view of the formation of the source and drain regions.

Next, as shown in FIG. 6, the gate oxide 26A and gate electrode 24 are formed using conventional methods. A fourth resist mask 42 is then formed using photoresist and standard photolithographic methods. The fourth resist mask 42 has an opening directly over the transistor. Heavily doped p+ source 16 and drain 18 regions art then formed using ion implantation wherein the ion implantation beam 38 is a beam of $BF_2$ ions implanted with an implantation energy of between about 60 and 80 kev, leaving a lightly doped drift region 17 having an impurity concentration of between about $3 \times 10^{16}$ and $7 \times 10^{16}$ atoms/cm$^3$. The source 16 and drain 18 regions have an impurity concentration of between about $5 \times 10^{19}$ and $2 \times 10^{20}$ atoms/cm$^3$. The channel region 11 is between the source region 16 and the drift region 17. The fourth resist mask 42 is then removed resulting in the completed high voltage device shown in FIG. 2. The device shown in FIG. 2 and described herein can operate at voltages up to about 35 volts between the source 16 and drain 18.

Figure 7:
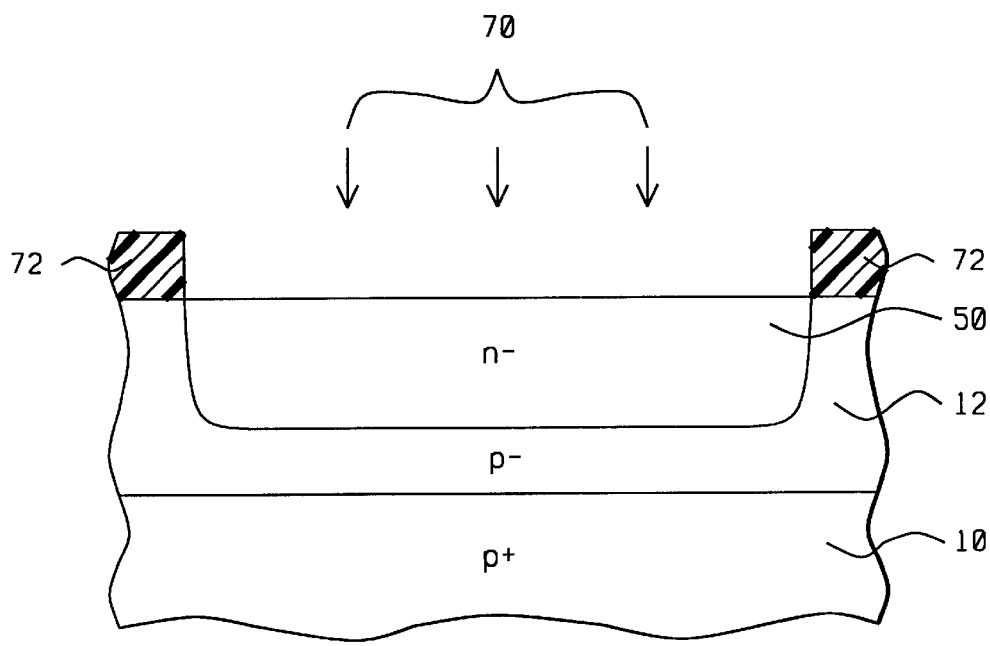
FIG. 7 shows a cross section view of the formation of a second n type well, in the same chip or wafer as the as the high voltage device, in which a standard P channel device will be formed.
Figure 8:
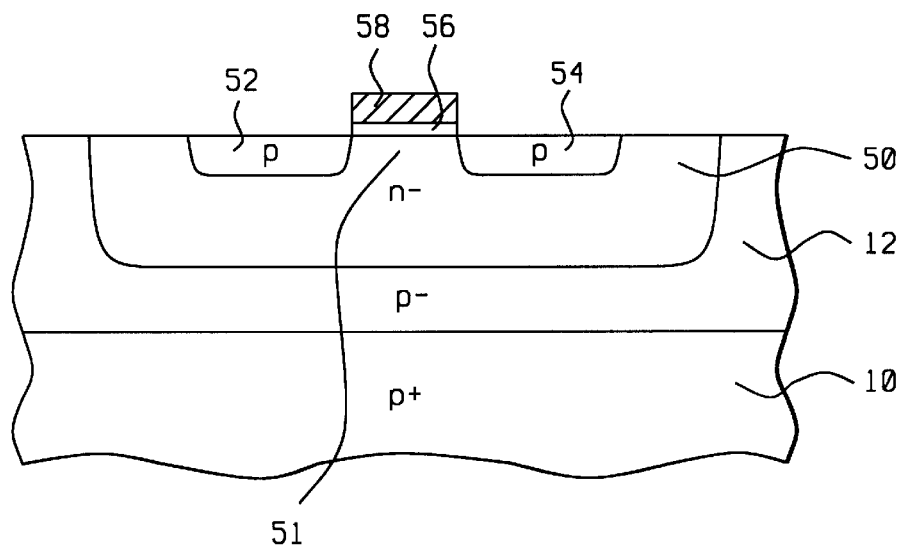
FIG. 8 shows a cross section view of a standard P channel device formed in the second n type well of FIG. 7.

The high voltage device shown in FIG. 2 can be integrated with standard devices on the same chip or wafer. FIG. 7 shows additional openings in the first resist mask 72 to form a second n− well 50 in the epitaxial layer using implantation of the same beam of phosphorous ions 70 used to form the well in which the high voltage device is formed. This is the same implantation as used to form the well in which the high voltage device is formed and uses an implantation energy of between about 120 and 180 kev, to form a lightly doped second n− type well 50 with an impurity concentration of between about $1 \times 10^{16}$ and $4 \times 10^{16}$ atoms/cm$^3$, which is the same as the well in which the high voltage device is formed. As shown in FIG. 8, standard p type source 52 and drain 54 regions are formed defining a channel region 51. A gate electrode 58 and gate oxide 56, silicon oxide, are formed over the channel region 51. This standard P channel device is integrated in the same chip or wafer as the previously described high voltage device.

Figure 9:
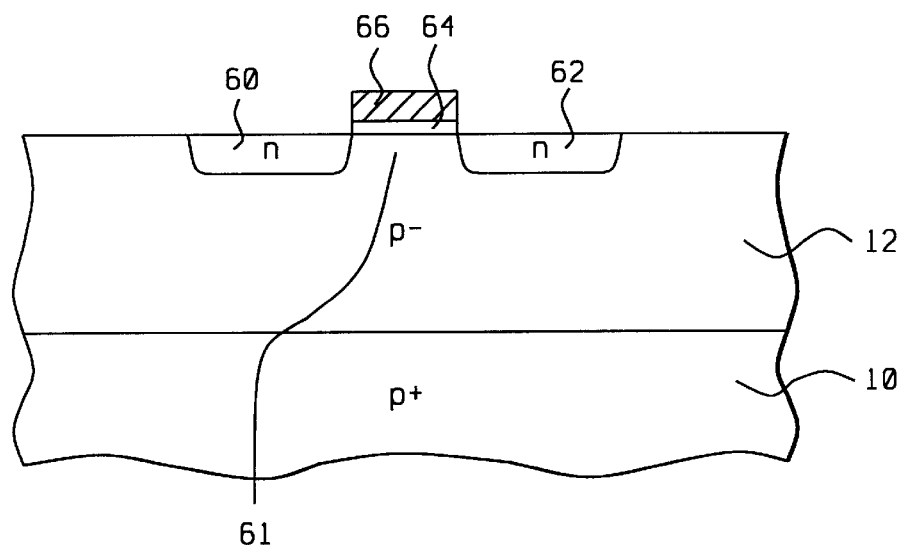
FIG. 9 shows a cross section view of a standard N channel device formed in the same chip or wafer as the high voltage device.

As shown in FIG. 9, standard n type source 60 and drain 62 regions are formed in the lightly doped epitaxial region 12 defining a channel region 61. A gate electrode 66 and gate oxide 64, silicon oxide, are formed over the channel region 61. This standard N channel device is integrated in the same chip or wafer as the previously described high voltage device and the previously described standard P channel device.

While the invention has been particularly shown and described with reference to the preferred embodiments thereof, it will be understood by those skilled in the art that various changes in form and details may be made without departing from the spirit and scope of the invention.

What is claimed is:

1. A high voltage metal oxide semiconductor device, comprising:

a substrate of p type silicon having between about $5 \times 10^{19}$ and $1.3 \times 10^{20}$ impurity atoms/cm$^3$;

an epitaxial layer of p type silicon having between about $1 \times 10^{35}$ and $3 \times 10^{15}$ impurity atoms/cm$^3$ formed on said substrate;

a first well, having a first channel region, formed within said epitaxial layer wherein said first well is n type silicon having between about $1 \times 10^{16}$ and $4 \times 10^{16}$ impurity atoms/cm$^3$ and said first channel region has a first edge and a second edge;

a drift region formed in said first well adjacent to said second edge of said first channel region wherein said drift region is p type silicon having between about $3 \times 10^{16}$ and $7 \times 10^{16}$ impurity atoms/cm$^3$;

a high voltage support region formed in said first well directly below said drift region wherein said high voltage support region is n type silicon having between about $5 \times 10^{15}$ and $2 \times 10^{16}$ impurity atoms/cm$^3$;

a thick oxide formed directly above said drift region;

a first gate formed on a first gate oxide above said first well and directly above said first channel region;

a first source formed in said first well adjacent to said first edge of said first channel region wherein said first source is p type silicon having between about $5 \times 10^{15}$ and $2 \times 10^{16}$ impurity atoms/cm$^3$; and a first drain formed in said first well adjacent to said drift region so that said drift region is between said first channel region and said first drain wherein said first drain is p type silicon having between about $5 \times 10^{19}$ and $2 \times 10^{20}$ impurity atoms/cm$^3$.

2. The high voltage metal oxide semiconductor device of claim 1 wherein said high voltage support region is formed using ion implantation of phosphorous ions using an ion implantation energy of between about 2 and 3 Mev, thereby enabling said high voltage support region to be located directly below said drift region.

3. The high voltage metal oxide semiconductor device of claim 1 wherein said thick oxide is a silicon oxide.

4. The high voltage metal oxide semiconductor device of claim 1 wherein said first gate oxide is a silicon oxide.

5. The high voltage metal oxide semiconductor device of claim 1 wherein said first gate extends from said first edge of said first channel region to said second edge of said second channel region.

6. The high voltage metal oxide semiconductor device of claim 1 wherein the operating voltage between said first source and said first drain is 35 volts or less.

7. The high voltage metal oxide semiconductor device of claim 1, further comprising:

a second well of n type silicon having between about $1 \times 10^{16}$ and $4 \times 10^{16}$ impurity atoms/cm$^3$ formed in said epitaxial layer outside of said first well;

a second source of p type silicon formed in said second well;

a second drain of p type silicon formed in said second well, thereby defining a second channel region in said second well between said second source and said second drain; and a second gate electrode and a second gate oxide formed over said second channel region.

8. The high voltage metal oxide semiconductor device of claim 1, further comprising:

a third source of n type silicon formed in said epitaxial layer outside of said first well;

a third drain of n type silicon formed in said epitaxial layer outside of said first well, thereby defining a third channel region in said epitaxial layer outside of said first well and between said third source and said third drain; and a third gate electrode and a third gate oxide formed over said third channel region.

* * * * *